United States Patent
Ha et al.

(10) Patent No.: US 11,967,608 B1
(45) Date of Patent: Apr. 23, 2024

(54) PIXEL INTEGRATE SCANNING (PIS) DISTRIBUTED TYPE AUTOMATIC POWER-SAVING ELECTRONIC DISPLAY BOARD

(71) Applicant: Dongbang data technology CO., Ltd, Seoul (KR)

(72) Inventors: Young-Jae Ha, Seoul (KR); Seong Jun Ha, Anyang-si (KR); Hyun Jun Ha, Gwacheon-si (KR)

(73) Assignee: DONGBANG DATA TECHNOLOGY CO., LTD, Seoul (KR)

( * ) Notice: Subject to any disclaimer, the term of this patent is extended or adjusted under 35 U.S.C. 154(b) by 0 days.

(21) Appl. No.: 18/326,199

(22) Filed: May 31, 2023

(30) Foreign Application Priority Data

Dec. 21, 2022 (KR) .......................... 10-2022-0180778

(51) Int. Cl.
*G09G 3/3283* (2016.01)
*H01L 27/15* (2006.01)

(52) U.S. Cl.
CPC ......... *H01L 27/156* (2013.01); *G09G 3/3283* (2013.01); *G09G 2300/0452* (2013.01); *G09G 2310/027* (2013.01); *G09G 2320/0276* (2013.01); *G09G 2320/066* (2013.01); *G09G 2330/021* (2013.01)

(58) Field of Classification Search
CPC .............................................. G09G 2330/021
See application file for complete search history.

(56) References Cited

U.S. PATENT DOCUMENTS

| | | | | |
|---|---|---|---|---|
| 2006/0103643 | A1* | 5/2006 | Mathew | G09G 3/3466 359/290 |
| 2008/0018800 | A1* | 1/2008 | Kodavalla | H04N 5/202 345/596 |
| 2009/0324074 | A1* | 12/2009 | Dembo | H04N 5/20 382/168 |

(Continued)

FOREIGN PATENT DOCUMENTS

| | | |
|---|---|---|
| KR | 1020080032047 A | 4/2008 |
| KR | 102185901 B1 | 12/2020 |

(Continued)

*Primary Examiner* — Sepehr Azari
(74) *Attorney, Agent, or Firm* — NKL LAW; Jae Youn Kim

(57) ABSTRACT

Provided is a pixel integrate scanning (PIS) distributed type automatic power-saving electronic display board, which histogram-equalizes a reference value of color values of an initial image signal on the basis of image pulses along with the drive control for easily implementing a high-definition image to set the value of a current (If) supplied to and flowing through the LED, and allows the gain controller to compare the set current value with a difference between the image reference value of the gamma controller and the correction value of the histogram-equalized image and determine a change in a subtraction loss value based on the power consumption difference of a display image in consideration of image quality change, brightness, and image size to designate a current value for display on the electronic display board and transmit corresponding image information so that the power-saving operation of the LED module is automatically performed.

4 Claims, 9 Drawing Sheets

(56) References Cited

U.S. PATENT DOCUMENTS

| | | | |
|---|---|---|---|
| 2011/0292022 A1* | 12/2011 | Lee | G09G 3/20 |
| | | | 345/212 |
| 2016/0104408 A1* | 4/2016 | Kim | G09G 3/36 |
| | | | 345/690 |
| 2019/0012772 A1* | 1/2019 | Michelini | G06T 5/40 |

FOREIGN PATENT DOCUMENTS

| | | |
|---|---|---|
| KR | 102213193 B1 | 2/2021 |
| KR | 102310632 B1 | 10/2021 |

* cited by examiner

PIXEL INTEGRATE SCANNING (PIS) DISTRIBUTED TYPE AUTOMATIC POWER-SAVING ELECTRONIC DISPLAY BOARD

CROSS-REFERENCE TO RELATED APPLICATIONS

This application claims the benefit of Korean Patent Application No. 10-2022-0180778, filed on Dec. 21, 2022 in the Korean Intellectual Property Office, which is incorporated herein by reference in its entirety.

BACKGROUND OF THE INVENTION

1. Field of the Invention

The present invention relates to saving the power of an LED electronic display board module, and more particularly, to a pixel integrate scanning (PIS) distributed type automatic power-saving electronic display board, which is configured to control a driving current of the LED electronic display board module according to a correction value of the image histogram-equalized by a PIS power-saving controller and a change in a subtraction loss value compared and distributed by a gain controller based on an image reference value of a gamma controller in response to an input image signal so that the drive of the LED electronic display board is controlled to enable to save the power supplied to an LED module to drive the electronic display board under the control of a PIS controller so as to prevent unnecessary power loss.

2. Description of Related Art

A light-emitting diode (LED) refers to a semiconductor device that emits light, and is widely used in electronic display panels such as various kinds of electronic products and dashboards in various colors such as red, green, blue, and yellow.

Among them, an LED electronic display board includes a plurality of LEDs arranged in a matrix form to form pixels for displaying an image to enable the image to be displayed thereon. The LED electronic display board is installed in various forms at the outside or inside of a building so as to transmit advertisements or various kinds of information.

Generally, an electronic display board system is known which displays various items of information such as characters or pictures by arranging LEDs or small fluorescent tubes in a matrix form.

The electronic display board system receives an image signal from such as a DVD, a VCR, an AV device such as broadcasting equipment or the like, and converts the image signal into a signal suitable for an electronic display board to allow an image to be displayed on the electronic display board.

In recent years, the LED electronic display board has evolved beyond simply conveying basic information through texts or still images and is widely used for displaying moving pictures (videos) such as TV commercials or the like. As the LED electronic display board is becoming larger in size along with its wide utilization, the power consumption of the LED electronic display board is also increasing. In recent years, there is a growing demand for a technology for reducing the power consumption of the LED electronic display board as an energy-saving technology is required continuously.

Accordingly, efforts have been made to operate the LED electronic display board with low power and minimize the standby power consumption. Korean Patent No. 10-2015635 entitled "High Efficiency LED Electronic Display Board for Blocking Standby Power" and Korean Patent No. 10-2015636 entitled "System for Blocking Standby Power by Extraction of No-Load LEDs" disclose a method of setting different driving times depending on a difference in brightness of LED colors to reduce power consumption. Korean Patent No. 10-1035026 entitled "Power-Saving LED Electronic Display Board Using Control of Standby Power" proposes a method of reducing standby power by interrupting electrical power in a situation where the LED electronic display board is operated in a standby mode under the control of a switching signal of a switched-mode power supply (SMPS) for supplying the electrical power to an LED display panel and a panel driving unit.

In other words, as shown in a circuit diagram of FIG. 1, the conventional LED electronic display board typically has a structure in which a resistor (R) has a fixed resistance value and is connected in series with an LED. Such an LED electronic display board is configured such that since the brightness of an image is determined depending on the amount of current (If) supplied, electronic display board is generally driven by fixing the resistance value of the resistor (R) for the brightness of the image and fixing the value of the LED CHIP's existing Vf, which makes it impossible to cope with a change in the operation current (If) value, resulting in a consumption of active power. Therefore, the above-mentioned conventional LED electronic display board entails a problem in that power consumption occurs in the LED module and the LED CHIP due to heat, leading to a reduction in the lifespan of the LED module.

Therefore, a conventional LED electronic display board control method involves a problem in that a power monitoring function is required to be performed on the entire system of the electronic display board, including a video source, a video control device, an LED module, and a power supply. In addition, a significant number of additional devices are required for an intelligent video analytics program to analyze videos which are to be displayed on the entire screen and required to control the on/off operation of an SMPS (Switched-Mode Power Supply) in a corresponding screen area. In other words, the conventional LED electronic display board encounters problems in that it requires complicated equipment such as a power monitoring device and a video analytics program for low-power design and in that a significant change should be made to an existing standardized system. Furthermore, the conventional LED electronic display board also has a drawback in that significant power consumption occurs in the additional devices. Accordingly, the applicant has proposed a power-saving approach of controlling the driving current of the LED module of the electronic display board in response to input image values (white, red, blue and green color values) to enable to save the power under the control of the PIS controller, thereby preventing unnecessary power loss, instead of a simple register circuit method of supplying power to the LED module in the display driving of the electronic display board.

DISCLOSURE OF INVENTION

Technical Problem

The present invention has been made to solve the above-mentioned problems occurring in the prior art, and it is an object of the present invention to provide a pixel integrate scanning (PIS) distributed type automatic power-saving electronic display board, which allows a PIS power-saving controller to histogram-equalize a reference value of color values of an initial image signal on the basis of image pulses along with the drive control for easily implementing a high-definition image to set the value of a current (If) supplied to and flowing through the LED, and allows the gain controller to compare the set current value with a difference between the image reference value of the gamma controller and the correction value of the histogram-equalized image and determine a change in a subtraction loss value based on the power consumption difference of a display image in consideration of image quality change, brightness, and image size to designate a current value for display on the electronic display board and transmit corresponding image information so that the power-saving operation of the LED module is automatically performed.

To accomplish the above object, the present invention provides a pixel integrate scanning (PIS) distributed type automatic power-saving electronic display board including: an image signal source configured to supply an image signal to be displayed on an LED electronic display board module; an MCU (Main Control Unit) configured to allow a PIS power-saving controller to histogram-equalize the image signal inputted from the image signal source to set the value of a current (If) flowing through an LED, and allow a gain controller to compare the set current value with a difference between an image reference value of a gamma controller and a correction value of the histogram-equalized image and determine a change in a subtraction loss value based on a power consumption difference of a display image in consideration of image quality change, brightness, and image size to designate a current value for display on the electronic display board and transmit corresponding image information so that a power-saving operation is performed; an SCU (Sub Control Unit) configured to transmit, as a signal with a PIS DATA value, a difference between pre-correction and post-correction images, to the LED electronic display board module to be displayed on the LED electronic display board module, based on a value determined by allowing the gain controller to compare the current value set by allowing the PIS power-saving controller of the MCU to histogram-equalize the image signal with the difference between the image reference value of the gamma controller and the correction value of the histogram-equalized image; an LED electronic display board module configured to form a screen by arranging, in a matrix form, a unit display module in which a plurality of LEDs are arranged for each of n×m Dot (RGB) pixels in the form of a module array, and receive and display image information according to the correction value of the image histogram-equalized by the PIS power-saving controller and the change in the subtraction loss value compared and distributed by the gain controller based on the image reference value of the gamma controller in response to the image signal inputted through an image input device.

The MCU (main control unit) of the PIS distributed type automatic power-saving electronic display board according to an embodiment of the present invention may further include: a main processor configured to receive an image data from the image signal source and generate a driving current to drive each of light sources of the LED electronic display board module; a frame memory configured to store the image data of the image signal source when the image data is reproduced through an image switcher, and retrieve and transmit the stored image data; a PIS power-saving controller configured to histogram-equalize the image signal inputted thereto through the frame memory to set the value of the current (If) flowing through the LED, and allow the gain controller to compare the set current value with the difference between the image reference value of the gamma controller and the correction value of the histogram-equalized image and determine the change in the subtraction loss value based on the power consumption difference of the display image in consideration of image quality change, brightness, and image size to designate a current value for display on the electronic display board so that the power-saving operation of the LED module is automatically performed; a gray pixel controller configured to adjust the refresh rate cycle based on the gray scale in response to the image signal inputted thereto from the image signal source to improve the refresh rates of high and low gray scales to capture a uniformly distributed balance in the time domain so that the frame frequency of the output image is adjusted to reduce flickering caused by pigmentation; a gamma controller configured to switch and display, by scanning, an image in which an image data value with a gamma value determined on a histogram has been gray-scaled by the gray pixel controller to perform an equalization operation on the image through gamma correction of the image and the histogram of the brightness of the image; and an auto flicker detector configured to set a flicker frequency detected and an integration time adjusted according to the occurrence of a flicker based on the input cycle and transmit the detected flicker frequency and the adjusted integration time to the LED electronic display board module to display a corresponding image signal on the LED electronic display board module so that an image with reduced flickering caused by pigmentation is displayed on the LED electronic display board module according to the temporal and cyclic flow.

In addition, the PIS Power saving controller of the PIS distributed type automatic power-saving electronic display board according to an embodiment of the present invention may further include: a histogram equalizer configured to equalize, the image signal in which the image data stored in the frame memory on a frame-by-frame basis is synchronized and generated by the gamma controller and applied to the histogram equalizer, by expressing, as a function, a ratio of the image signal to the number of pixels, and making contrast value distribution uniform to divide contrast values concentrated on one spot to thereby set an image reference value of a gamma value; a gain controller configured to histogram-equalize the image data stored in the frame memory and inputted thereto to set the value of a current (If) flowing through the LED, and allows a gain controller to compare the set current value with a difference between an image reference value of a gamma controller and a correction value of the histogram-equalized image and determine and perceive a change in a subtraction loss value based on a power consumption difference of a display image in consideration of image quality change, brightness, and image size; and a PIS controller configured to allow the histogram equalizer to histogram-equalize the image data inputted thereto to set the value of the current (If) flowing through the LED, and allow the gain controller to compare the set current value with the difference between the image reference value of the gamma controller and the correction value of the histogram-equalized image and determine the change in the subtraction loss value based on the power consumption difference of the display image in consideration of image quality change, brightness, and image size to designate the current value for display on the electronic display board and transmit the determined information so as to control the power-saving operation of the LED module to be performed.

Effects of the Invention

The pixel integrate scanning (PIS) distributed type automatic power-saving electronic display board according to an embodiment of the present invention has an effect in that it controls the driving current of the LED electronic display board module according to the correction value of the image histogram-equalized by the PIS power-saving controller and the change in the subtraction loss value compared and distributed by the gain controller based on the image reference value of the gamma controller in response to the input image signal so as to enable to save the power supplied to the LED module to drive the electronic display board, thereby preventing unnecessary power loss.

In addition, the pixel integrate scanning (PIS) distributed type automatic power-saving electronic display board according to an embodiment of the present invention has an effect in that it allows the PIS power-saving controller to histogram-equalize a reference value of color values (white, red, blue and green) of an initial image signal on the basis of image pulses to set the value of a current (If) supplied to and flowing through the LED, and allows the gain controller to compare the set current value with a difference between the image reference value of the gamma controller and the correction value of the histogram-equalized image and determine a change in a subtraction loss value based on the power consumption difference of a display image in consideration of image quality change, brightness, and image size to designate a current value for display on the electronic display board and transmit corresponding image information so that the power-saving operation of the LED module is automatically performed, thereby minimizing power loss according to the driving of the LED electronic display board.

Further, the pixel integrate scanning (PIS) distributed type automatic power-saving electronic display board according to an embodiment of the present invention has an effect in that it histogram-equalizes the value of the input image signal, and sets a value determined by the gain controller as a reference value and equalizes the set value to designate a current (If) value for display on the LED module using a difference between pre-correction and post-correction images as a signal with a PIS DATA value so that a power-saving operation is performed based on a power consumption difference of the display image using a difference between the image reference value of the gamma controller and the correction value of the histogram-equalized image and the driving current of the LED module is controlled to overcome a limitation in the power consumption according to the driving of the electronic display board.

BRIEF DESCRIPTION OF THE DRAWINGS

The above and other objects, features and advantages of the present invention will be apparent from the following detailed description of the preferred embodiments of the invention when taken in conjunction with the accompanying drawings, in which.

THE DESCRIPTION OF REFERENCE NUMERALS OF THE MAIN ELEMENTS IN THE DRAWINGS

100: image signal source
200: MCU (Main Control Unit)
210: Main Processor 220: Frame memory
230: PIS Power Saving Controller
231: PIS Controller 233: Histogram Equalizer
235: Gain Controller
240: Gray Pixel Controller 250: Gamma Controller
260: Gamma Corrector 270: Auto Flicker Detector
300: SCU (Sub Control Unit)
340: PIS DATA Controller
400: LED electronic display board Module

DETAILED DESCRIPTION OF THE PREFERRED EMBODIMENTS

Now, preferred embodiments of the present invention will be described in detail with reference to the accompanying drawings. In the following description, the detailed description on relevant known functions and constructions unnecessarily obscuring the subject matter of the present invention will be avoided hereinafter.

In this specification, any one constituent element 'transmit' a data or signal to another constituent element means that the constituent element may directly transmit the data or signal to the other constituent element or may transmit the data or signal to the other constituent element via at least another constituent element.

The present invention provides an LED electronic display board control technology which controls a driving current of the LED electronic display board module according to a correction value of the image histogram-equalized by a PIS power-saving controller and a change in a subtraction loss value compared and distributed by a gain controller based on an image reference value of a gamma controller in response to an input image signal so as to enable to save the power supplied to an LED module generally driven by a simple register circuit to control a driving power of the LED electronic display board under the control of a PIS controller, thereby preventing unnecessary power.

Figure 1:
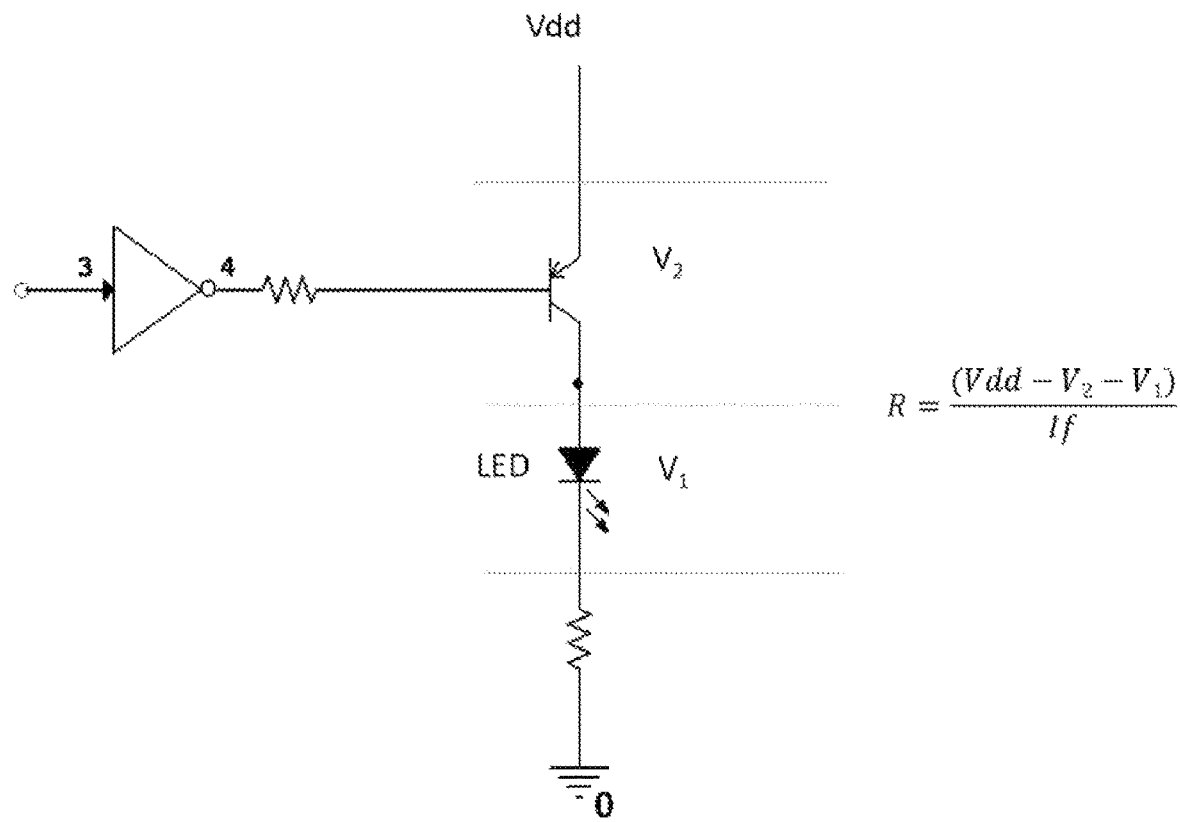
FIG. 1 is a circuit diagram showing a configuration of a Dot Register of a conventional LED module according to the prior art.
Figure 2:
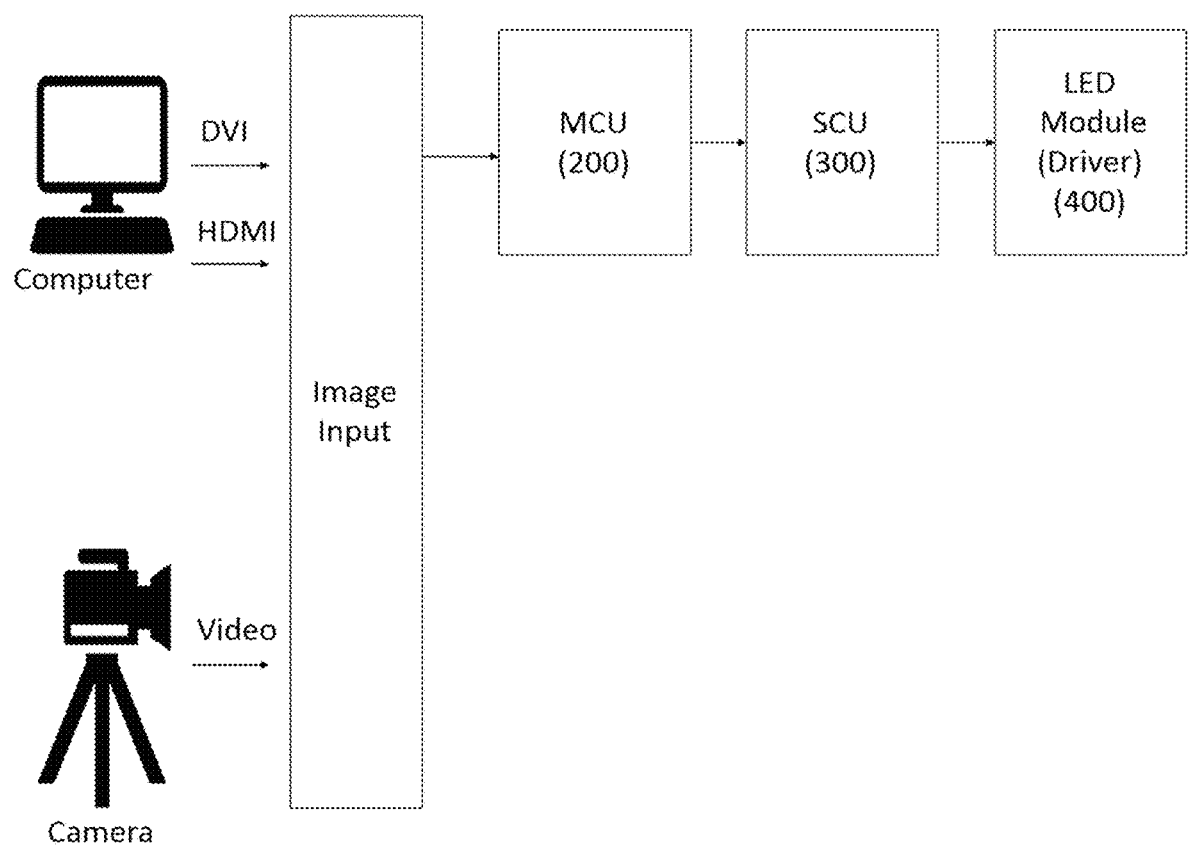
FIG. 2 is a block diagram showing a configuration of a PIS (Pixel Integrate Scanning) distributed type automatic power-saving electronic display board according to the present invention.

FIG. 2 is a circuit diagram showing a detailed configuration of a PIS (Pixel Integrate Scanning) distributed type automatic power-saving electronic display board according to the present invention.

Referring to FIG. 2, the PIS (Pixel Integrate Scanning) distributed type automatic power-saving electronic display board includes an image signal source 100, an MCU 200, an SCU 300, and an electronic display board module 400.

The image signal source 100 provides an image signal to the LED electronic display board module 400. The LED electronic display board module 400 is configured in the form of a Dot (R,G,B) pixel and receives the image signal from the image signal source 100 to display an image in such a manner that the dot pixel is arranged in a multi form by a driving display Dot (R,G,B).

The image signal source 100, which is a source that supplies an image signal to be displayed on the LED electronic display board module 400, may be either a device that plays back a storage medium such as a DVD, an HDMI, a DP, or a VCR, or a computer that retrieves video data stored in a memory and transmits the video data to the LED electronic display board module 400, but it is not limited to thereto.

The MCU (Main Control Unit) 200 allows a PIS power-saving controller 230 to histogram-equalize the image signal inputted from the image signal source 100 to set the value of a current (If) flowing through an LED, and allows a gain controller 235 to compare the set current value with a difference between an image reference value of a gamma controller 250 and a correction value of the histogram-equalized image and determine a change in a subtraction loss value based on a power consumption difference of a display image in consideration of image quality change, brightness, and image size so that a power-saving operation is performed automatically and corresponding image information is displayed on the LED electronic display board module 400.

The SCU (Sub Control Unit) 300 transmits, as a signal with a PIS DATA value, a difference between pre-correction and post-correction images to the LED electronic display board module 400 to be displayed on the LED electronic display board module 400, based on a value determined by allowing the gain controller 235 to compare the current value set by allowing the PIS power-saving controller 230 of the MCU 200 to histogram-equalize the image signal with the difference between the image reference value of the gamma controller 250 and the correction value of the histogram-equalized image.

In other words, in the control of the image display of an electronic display board that is generally driven, a simple distribution transmission function is adopted in which the image data from the MCU 200 is directly transmitted to the LED electronic display board module 400 to control the image data to enable to display the image.

The PIS power-saving controller 230 of the MCU 200 of the present invention histogram-equalizes a reference value of the color (white, red, blue and green) of the input image signal to set the value of the current (If) flowing through the LED, and the gain controller compares the set current value with the difference between the image reference value of the gamma controller and the correction value of the histogram-equalized image so that the difference between pre-correction and post-correction images is transmitted to the LED electronic display board module 400 as the signal with the PIS DATA value to be displayed on the LED electronic display board module 400 in consideration of image quality change, brightness, and image size.

The LED electronic display board module 400 forms a screen by arranging, in a matrix form, a unit display module in which a plurality of LEDs are arranged for each of n×m Dot (RGB) pixels in the form of a module array, and the MCU 200 controls a driving signal of the LED electronic display board module to enable to perform a display operation according to the correction value of the image histogram-equalized by the PIS power-saving controller and the change in the subtraction loss value compared and distributed by the gain controller based on the image reference value of the gamma controller in response to the image signal inputted through an image input device.

In addition, the LED electronic display board module 400 forms a screen by arranging, in a matrix form, a unit display module in which a plurality of LEDs are arranged for each of n×m pixels in the form of a module array, and displays image data generated by correcting brightness for image-data inputted through real-time synthesis between an image data stream and a brightness correction data applied in consideration of the luminance of the pixel of the electronic display board or the brightness value in response to the image signal inputted through the image signal source.

Figure 3:
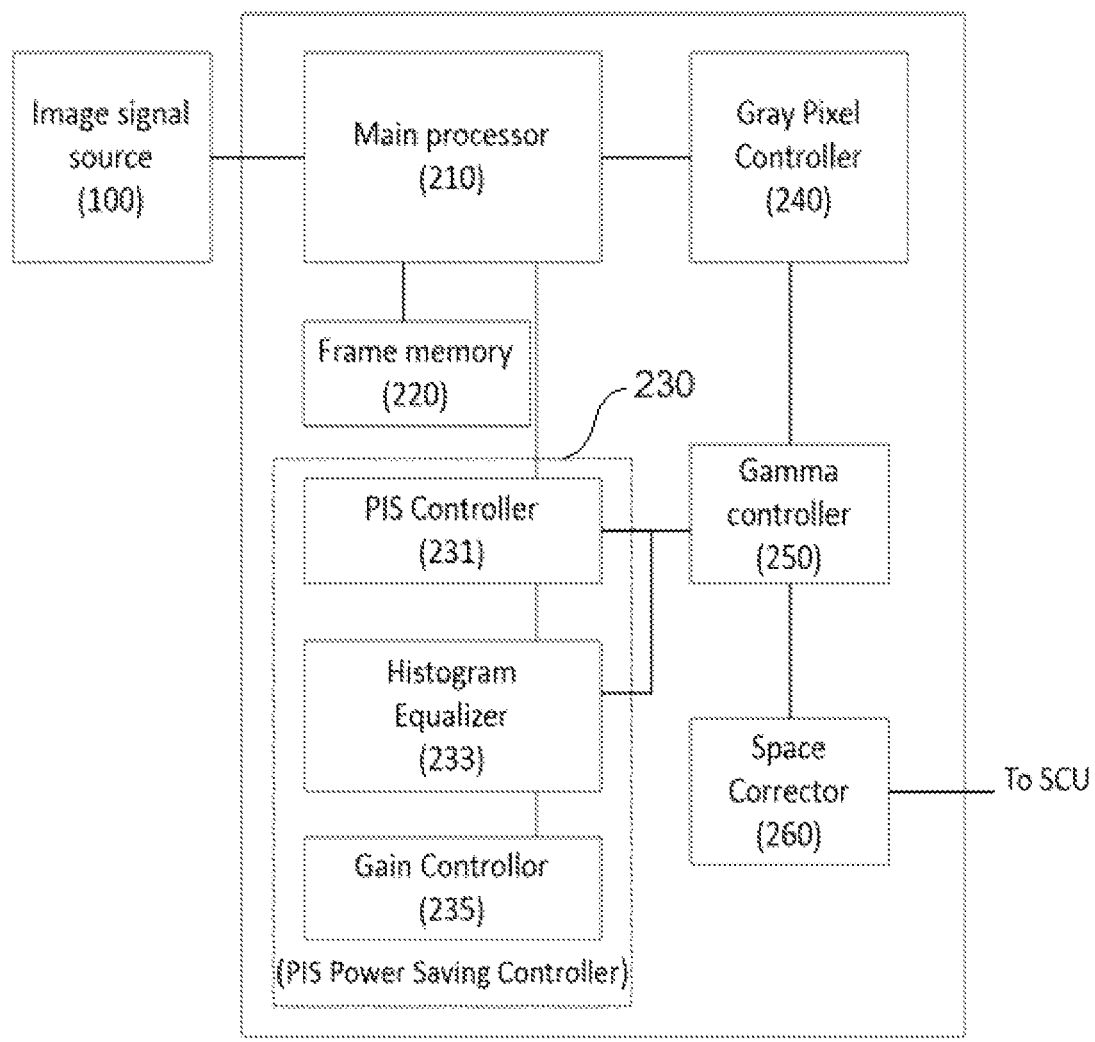
FIG. 3 is a block diagram showing a configuration of an MCU of a PIS (Pixel Integrate Scanning) distributed type automatic power-saving electronic display board according to the present invention.
Figure 4:
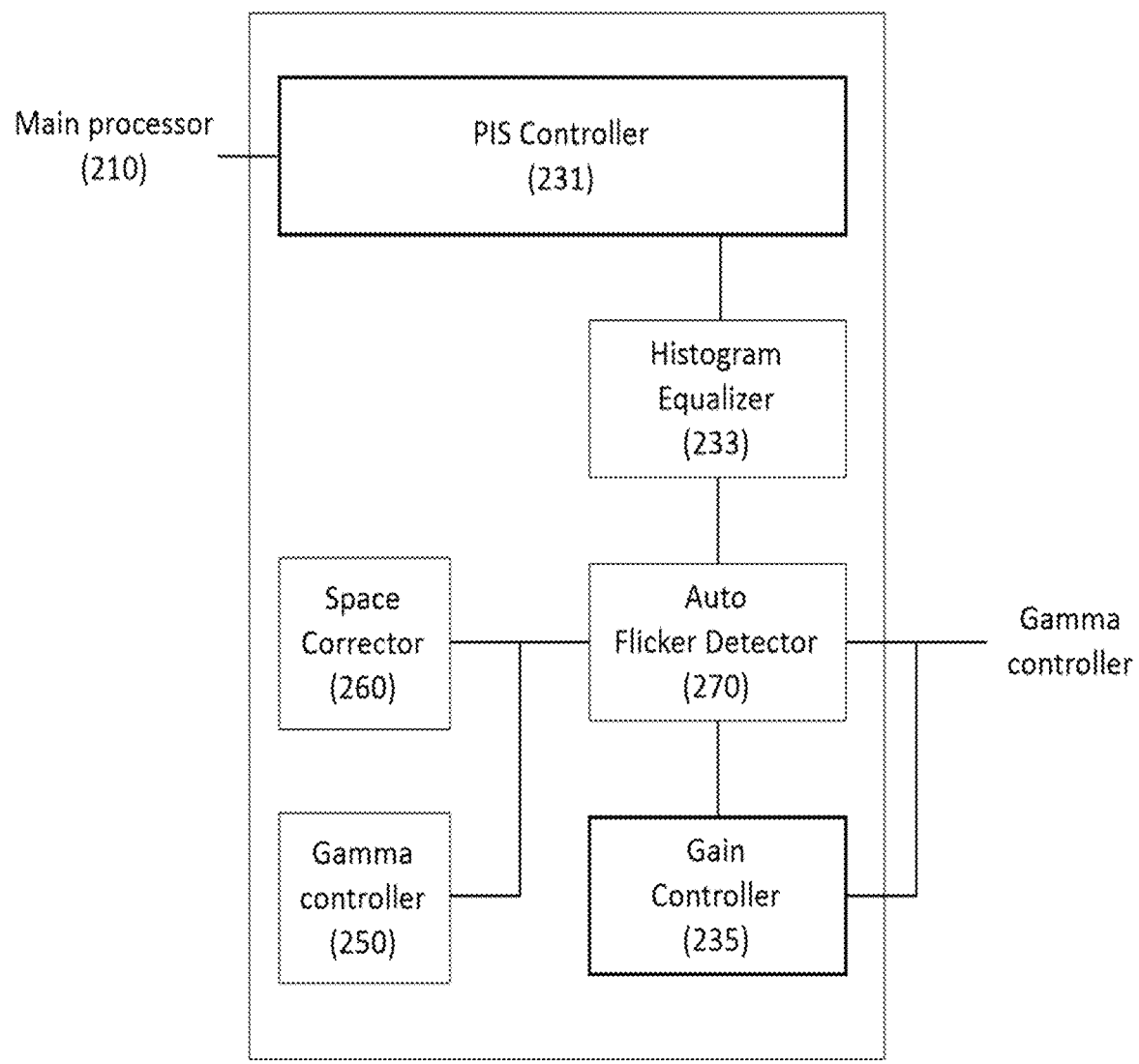
FIG. 4 is a block diagram showing an inner configuration for PIS power automatic control drive of the MCU of FIG. 3.
Figure 5:
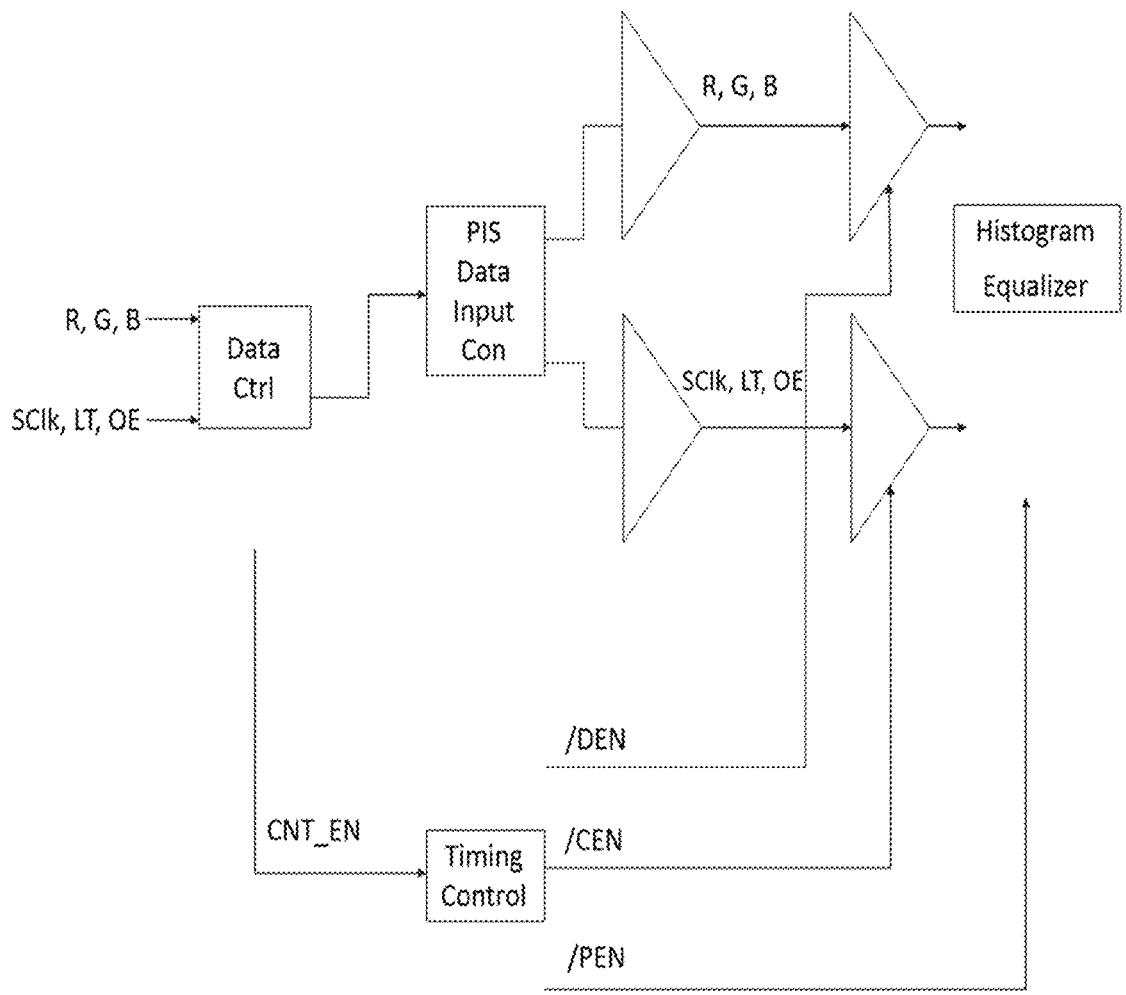
FIG. 5 is a detailed circuit diagram for the drive of a PIS controller of FIG. 4.

FIG. 3 is a block diagram showing a configuration of an MCU of a PIS (Pixel Integrate Scanning) distributed type automatic power-saving electronic display board according to the present invention, and FIG. 4 is a block diagram showing an inner configuration for PIS power automatic control drive of the MCU of FIG. 3.

The detailed configuration and operation of the MCU of the PIS distributed type automatic power-saving electronic display board will be described hereinafter with reference to FIGS. 2 to 4.

The MCU 200 includes a main processor 210, a frame memory 220, a PIS power saving controller 230, a gray pixel controller 240, a gamma controller 250, a space corrector 260, and an auto flicker detector 270.

The MCU (main control unit) 200 allows a PIS power-saving controller 230 to histogram-equalize the image signal inputted from the image signal source 100 to set the value of a current (If) flowing through an LED, and allows a gain controller 235 to compare the set current value with a difference between an image reference value of a gamma controller 250 and a correction value of the histogram-equalized image and determine and perceive a change in a subtraction loss value based on a power consumption difference of a display image in consideration of image quality change, brightness, and image size, to automatically enable the power-saving operation of the electronic display board in the display drive of the electronic display board.

More specifically, the main processor 210 receives an image data from the image signal source 100 and generates a driving current to drive each of light sources of the LED electronic display board module 400. The frame memory 220 stores the image data of the image signal source 100 when the image data is reproduced through an image switcher, and retrieves and transmits the stored image data.

Meanwhile, the PIS power-saving controller 230 includes a PIS controller 231, a histogram equalizer 233, and a gain controller 235. The histogram equalizer 233 equalizes, the image signal in which the image data stored in the frame memory 220 on a frame-by-frame basis is synchronized and generated by the gamma controller 250 and applied to the histogram equalizer 233, by expressing, as a function, a ratio of the image signal to the number of pixels, and making contrast value distribution uniform to divide contrast values concentrated on one spot to thereby set an image reference value of a gamma value.

The Gain Controller 235 is configured to histogram-equalize the image signal stored in the frame memory 220 and inputted thereto to set the value of a current (If) flowing through the LED, and compare the set current value with the difference between the image reference value of the gamma controller 250 and the correction value of the histogram-equalized image and determine and perceive a change in a subtraction loss value based on the power consumption difference of the display image in consideration of image quality change, brightness, and image size, to automatically enable the power-saving operation of the electronic display board in the display drive of the electronic display board.

In other words, the gain controller 235 adjusts a fresh rate higher for a low gray scale and divides a high gray scale range into further sections to increase it by a multiple of the refresh rate as the high gray scale does not have an effect on the fresh rate. Since the frame frequency of the output image increases without effectiveness, an effect of improving the image quality can be obtained by lowering the gray scale of the output image and thus smoothly processing the image.

The PIS controller 231 allows the histogram equalizer 233 to histogram-equalize the image data inputted thereto to set the value of the current (If) flowing through the LED, and allows the gain controller 235 to compare the set current value with the difference between the image reference value of the gamma controller 250 and the correction value of the histogram-equalized image and determine the change in the subtraction loss value based on the power consumption difference of the display image in consideration of image quality change, brightness, and image size to designate the current value for display on the electronic display board and transmit the determined information so as to control the power-saving operation of the LED module 400 to be performed automatically.

The gray pixel controller 240 adjusts the refresh rate cycle based on the gray scale in response to the image signal inputted thereto from the image signal source 100 to improve the refresh rates of high and low gray scales to capture a uniformly distributed balance in the time domain so that the frame frequency of the output image is adjusted to reduce flickering caused by pigmentation.

Additionally, the gray pixel controller 240 generates the driving current to drive each of light sources of the LED electronic display board module 400 based on the image signal inputted thereto from the image signal source 100, and stores the image inputted thereto from the frame memory 220 on a frame-by-frame basis. In addition, the gray pixel controller 240 adjusts the refresh rate cycle of a low gray scale with respect to the kind of image information inputted from the gain controller 235 to improve the refresh rates of high and low gray scales to capture a uniformly distributed balance in the time domain so that the frame frequency of the output image is adjusted to reduce flickering caused by pigmentation.

The gamma controller 250 switches and displays, by scanning, an image in which an image data value with a gamma value determined on a histogram by a gamma controller 250 has been gray-scaled by the gray pixel controller 240 to perform an equalization operation on the image through gamma correction of the image and the histogram of the brightness of the image.

Additionally, the gamma controller 250 controls brightness correction so as to enhance the uniformity of White Balance, color, and brightness of an image which is displayed based on a dot output value and a gray scale pixel value of the LED module. In other words, the gamma controller 250 converts the displayed image into a gray scale bit source image signal of a target value with respect to the controlled refresh rate according to a gray scale adjusted through the gain controller 235 and generates a gray scale clock suitable for a gray scale bit conversion logic and a control and synchronization signal of a horizontal synchronization signal and a data clock for transmission to control brightness correction so as to enhance the uniformity of White Balance, color, and brightness of an image which is displayed based on a dot output value and a gray scale pixel value of the LED module.

The space corrector 260 generate the gray scale clock suitable for a gray scale bit conversion logic and the control and synchronization signal of the horizontal synchronization signal and the data clock for transmission.

The auto flicker detector 270 sets a flicker frequency detected and an integration time adjusted according to the occurrence of a flicker based on the input cycle and transmits the detected flicker frequency and the adjusted integration time to the LED electronic display board module 400 to display a corresponding image signal on the LED electronic display board module 400 so that an image with reduced flickering caused by pigmentation is displayed on the LED electronic display board module 400 according to the temporal and cyclic flow.

Figure 6:
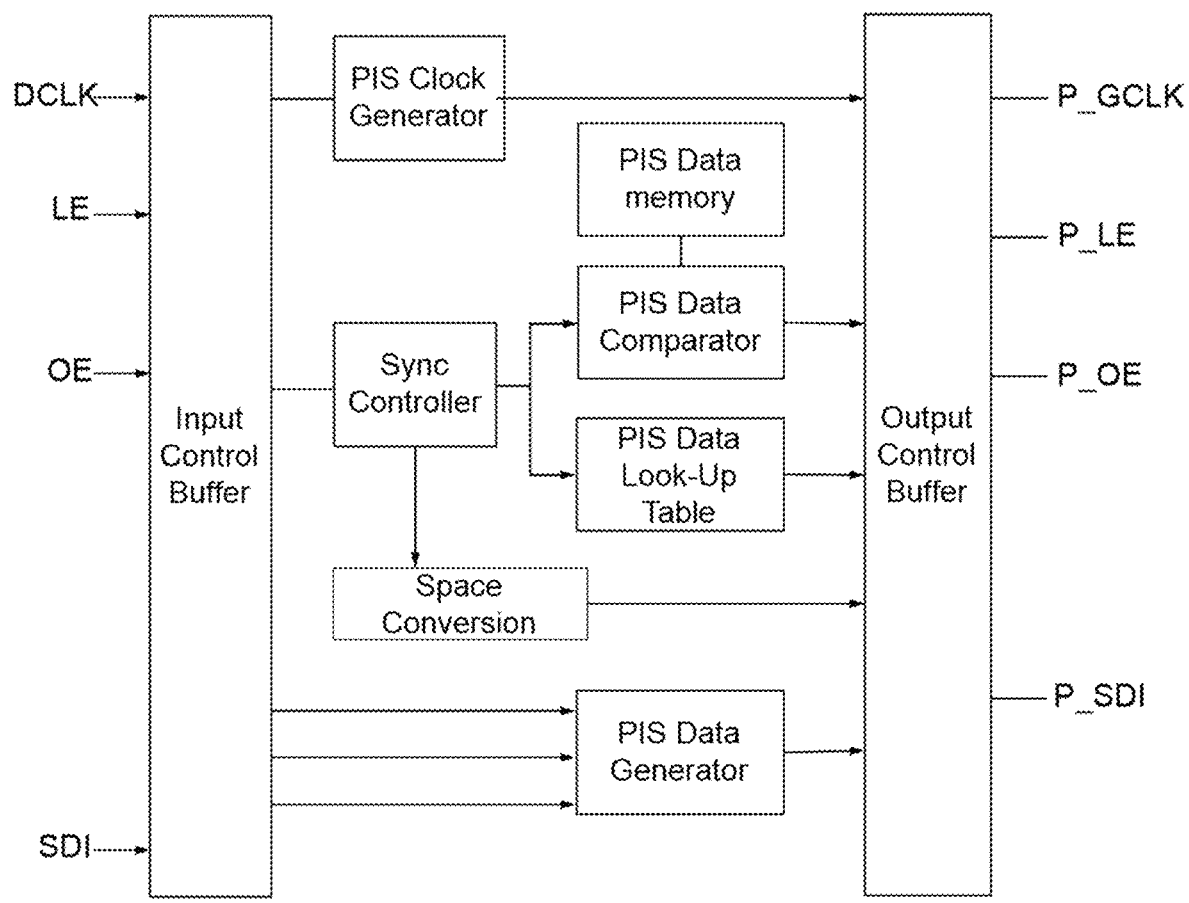
FIG. 6 is a block diagram showing a configuration of an SCU of a PIS (Pixel Integrate Scanning) distributed type automatic power-saving electronic display board according to the present invention.
Figure 7:
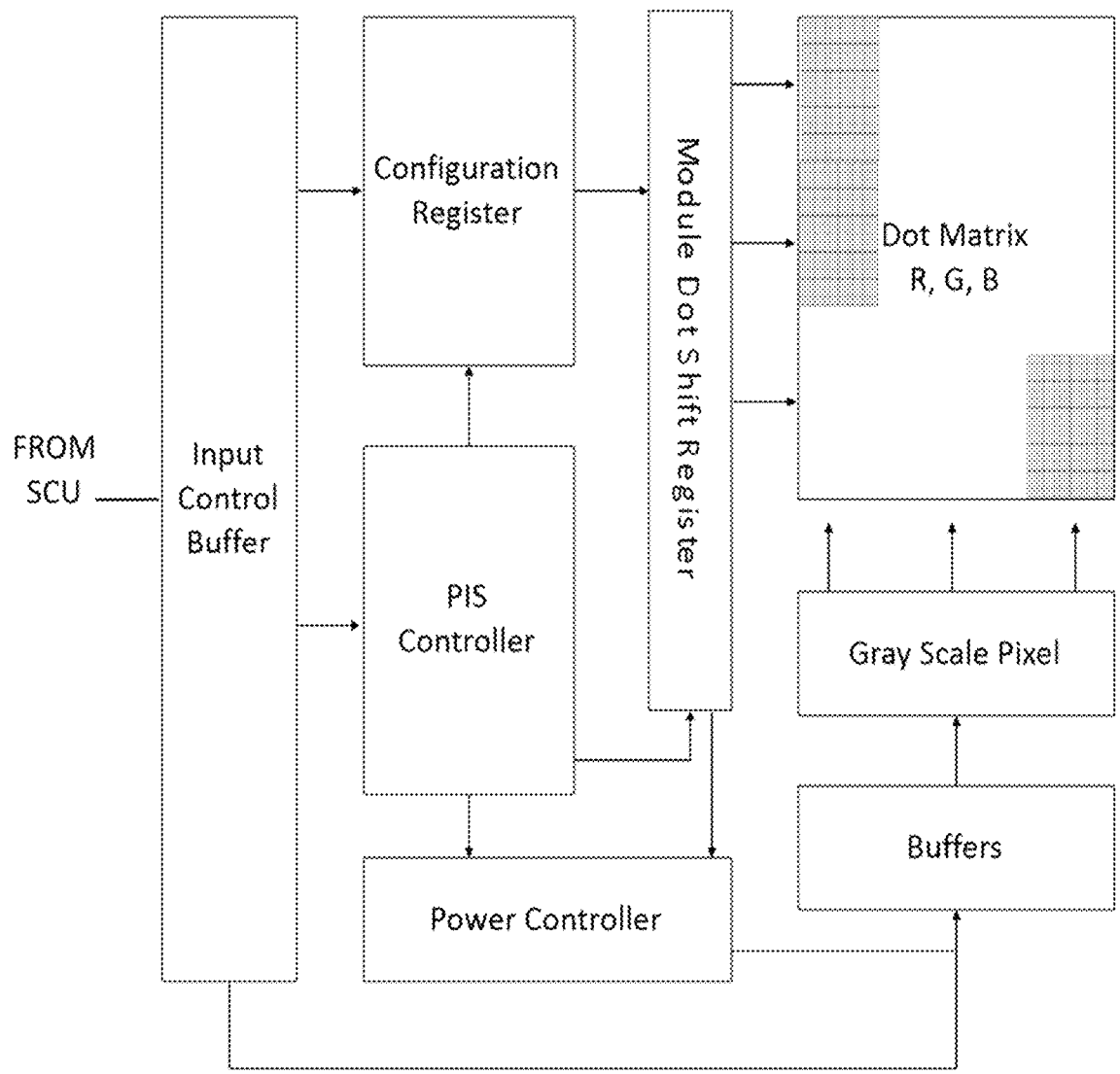
FIG. 7 is a block diagram showing an inner configuration of a module drive unit of FIG. 6.
Figure 8:
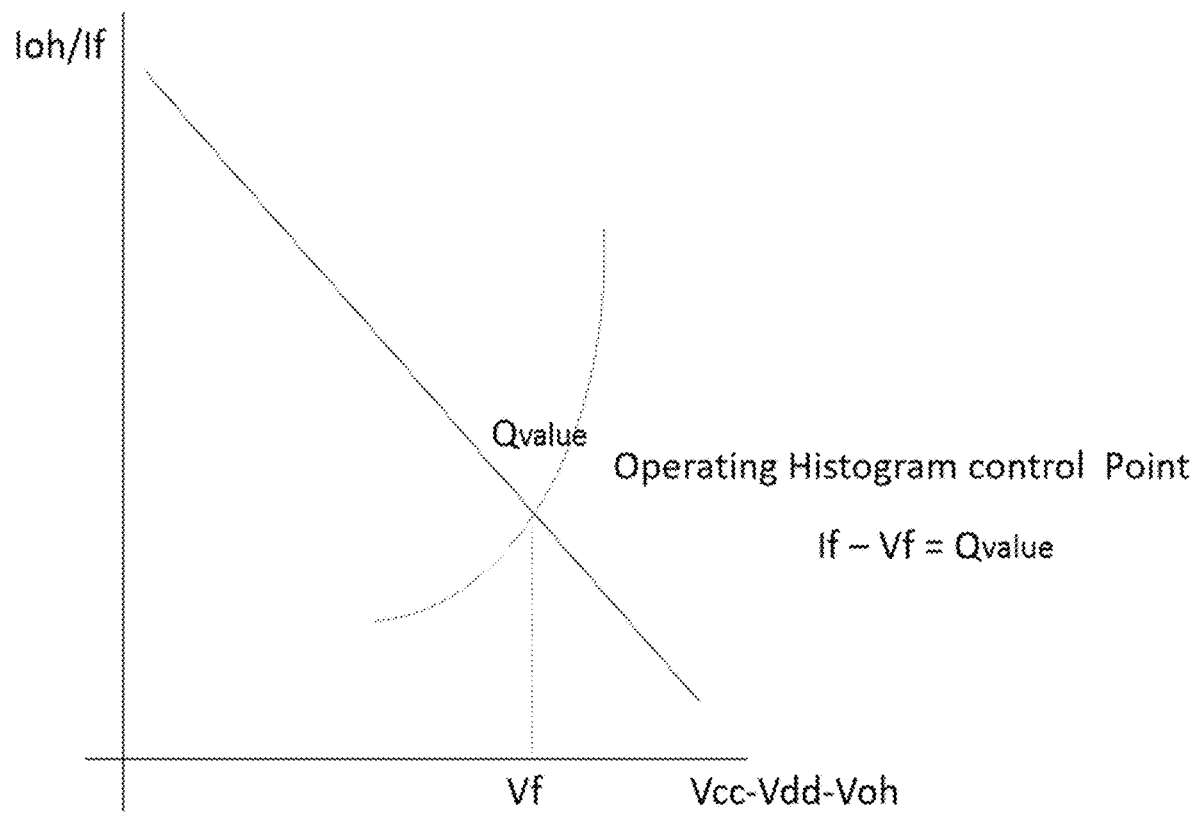
FIG. 8 is a diagrammatic view showing a PIS drive histogram control operation state according to the present invention.

FIG. 6 is a block diagram showing a configuration of an SCU of a PIS (Pixel Integrate Scanning) distributed type automatic power-saving electronic display board according to the present invention, FIG. 7 is a block diagram showing an inner configuration of a module drive unit of FIG. 6, and FIG. 8 is a diagrammatic view showing a PIS drive histogram control operation state according to the present invention.

The SCU 300 includes a PIS video controller 310, a PIS video buffer controller 320, and a PIS data-controller 340.

The PIS video controller 310 histogram-equalizes the image signal inputted thereto according to the driving of the PIS power-saving controller 230 of the MCU (main control unit) 200 to set the value of the current (If) flowing through the LED, and allow the gain controller (235) to compare the set current value with the difference between the image reference value set by the gamma controller 250 and the correction value of the histogram-equalized image and determine the change in the subtraction loss value based on the power consumption difference of the display image in consideration of image quality change, brightness, and image size so that when the gray scale clock suitable for a gray scale bit conversion logic and the control and synchronization signal of the horizontal synchronization signal and the data clock for transmission, which have been generated by the space corrector 260, are transmitted to and stored in the PIS video buffer, and then displayed on the LED module 400 by the PIS data controller 340 as a signal with a PIS video value.

In other words, the current supplied to the LED module 400 is determined based on the pulse wave of the input video. The current (If) supplied to the LED module 400 flows when the video pulse wave is "1". The PIS data controller 340 sets "1" as a reference value based on a value determined by the gain controller so that a difference between pre-correction and post-correction images, i.e., a display current value of the LED module 400 is set as a signal with a PIS data value, and thus the difference between the image reference value of the gamma controller and the correction value of the histogram-equalized image enables to perform the power-saving operation based on the power consumption difference of the display image.

Figure 9:
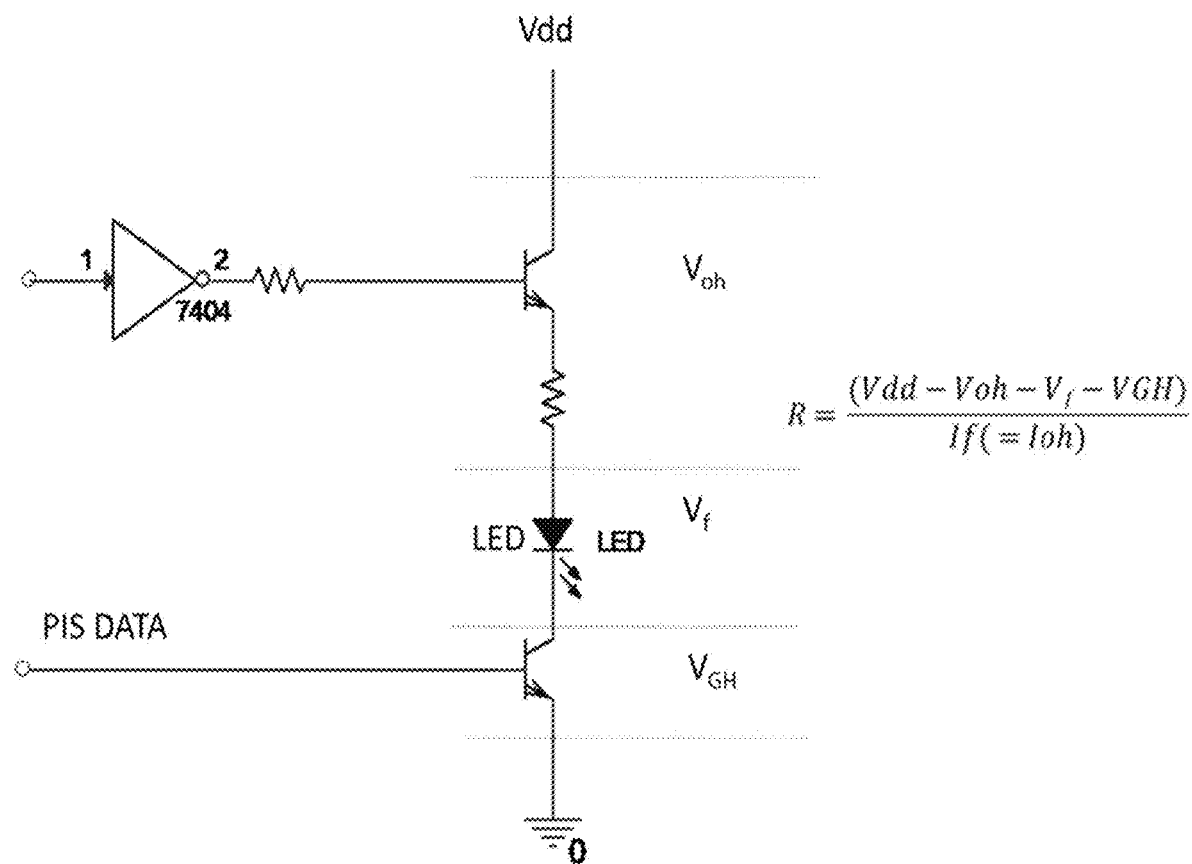
FIG. 9 is a circuit diagram showing a configuration of a Dot Register of an LED module according to the present invention.

In the case of the conventional LED electronic display board having a structure in which a resistor (R) has a fixed resistance value is connected in series with an LED as in a configuration of the Dot register of LED module applied to the present invention as shown in FIG. 9, the electronic display board is driven by fixing the resistance value of the resistor (R) for the brightness of the image and fixing the value of the LED CHIP's existing Vf, which makes it impossible to cope with a change in the operation current (If) value, resulting in a consumption of active power. Therefore, in order to solve the conventional LED electronic display board associated problem in that power consumption occurring in the LED module and the LED CHIP due to heat generated leads to a reduction in the lifespan of the LED module, the PIS data controller is additionally provided at an end of the LED to allow a reference value of color values (white, red, blue and green) of an initial image signal based on simple image pulses to be histogram-equalized to set the value of a current (If) flowing through the LED based on the PIS DATA value so that a difference between the image reference value of the gamma controller 250 and the correction value of the histogram-equalized image and determine a change in a subtraction loss value causes the occurrence of the power consumption difference of a display image to enable to perform a power-saving operation, resulting in an increase in the lifespan of the LED module and an implementation of the power-saving solution.

What is claimed is:

1. A pixel integrate scanning (PIS) distributed type automatic power-saving electronic display board comprising: an image signal source configured to supply an image signal to be displayed on an LED electronic display board module; a main control unit (MCU) configured to allow a PIS power-saving controller to histogram-equalize the image signal inputted from the image signal source to set a value of a current flowing through an LED, and allow a gain controller to compare the set current value with a difference between an image reference value of a gamma controller and a correction value of the histogram-equalized image and determine a change in a subtraction loss value based on a power consumption difference of a display image in consideration of image quality change, brightness, and image size to designate a current value for display on the electronic display board and transmit corresponding image information so that a power-saving operation is performed; a sub-control unit (SCU) configured to transmit, as a signal with a PIS DATA value, a difference between pre-correction and post-correction images, to the LED electronic display board module to be displayed on the LED electronic display board module, based on a value determined by allowing the gain controller to compare the current value set by allowing the PIS power-saving controller of the MCU to histogram-equalize the image signal with the difference between the image reference value of the gamma controller and the correction value of the histogram-equalized image; an LED electronic display board module configured to form a screen by arranging, in a matrix form, a unit display module in which a plurality of LEDs are arranged for each of n×m Dot RGB pixels in the form of a module array, and receive and display image information according to the correction value of the image histogram-equalized by the PIS power-saving controller and the change in the subtraction loss value compared and distributed by the gain controller based on the image reference value of the gamma controller in response to the image signal inputted through an image input device.

2. The PIS distributed type automatic power-saving electronic display board according to claim 1, wherein the MCU is configured to control a driving current of the LED electronic display board module according to the correction value of the image histogram-equalized by the PIS power-saving controller and the change in the subtraction loss value compared and distributed by the gain controller based on the image reference value of the gamma controller in response to the input image signal so that the drive of the LED electronic display board is controlled to enable to save the power under the control of a PIS controller so as to prevent unnecessary power loss.

3. The PIS distributed type automatic power-saving electronic display board according to claim 1, wherein the MCU further comprises: a main processor configured to receive an image data from the image signal source and generate a driving current to drive each of light sources of the LED electronic display board module; a frame memory, configured to store the image data of the image signal source when the image data is reproduced through an image switcher, and retrieve and transmit the stored image data; a PIS power-saving controller configured to histogram-equalize the image signal inputted thereto through the frame memory to set the value of the current flowing through the LED, and allow the gain controller to compare the set current value with the difference between the image reference value of the gamma controller and the correction value of the histogram-equalized image and determine the change in the subtraction loss value based on the power consumption difference of the display image in consideration of image quality change, brightness, and image size to designate a current value for display on the electronic display board so that the power-saving operation of the LED module is automatically performed; a gray pixel controller configured to adjust the refresh rate cycle based on the gray scale in response to the image signal inputted thereto from the image signal source to improve the refresh rates of high and low gray scales to capture a uniformly distributed balance in the time domain so that the frame frequency of the output image is adjusted to reduce flickering caused by pigmentation; a gamma controller configured to switch and display, by scanning, an image in which an image data value with a gamma value determined on a histogram has been gray-scaled by the gray pixel controller to perform an equalization operation on the image through gamma correction of the image and the histogram of the brightness of the image; and an auto flicker detector configured to set a flicker frequency detected and an integration time adjusted according to the occurrence of a flicker based on the input cycle and transmit the detected flicker frequency and the adjusted integration time to the LED electronic display board module to display a corresponding image signal on the LED electronic display board module so that an image with reduced flickering caused by pigmentation is displayed on the LED electronic display board module according to the temporal and cyclic flow.

4. The PIS distributed type automatic power-saving electronic display board according to claim 3, wherein the PIS Power saving Controller further comprises: a histogram equalizer configured to equalize, the image signal in which the image data stored in the frame memory on a frame-by-frame basis is synchronized and generated by the gamma controller and applied to the histogram equalizer, by expressing, as a function, a ratio of the image signal to the number of pixels, and making contrast value distribution uniform to divide contrast values concentrated on one spot to thereby set an image reference value of a gamma value; a gain controller configured to histogram-equalize the image data stored in the frame memory and inputted thereto to set the value of the current flowing through the LED, and allows the gain controller to compare the set current value with the difference between the image reference value of the gamma controller and the correction value of the histogram-equalized image and determine and perceive the change in the subtraction loss value based on the power consumption difference of the display image in consideration of image quality change, brightness, and image size; and a PIS controller configured to allow the histogram equalizer to histogram-equalize the image data inputted thereto to set the value of the current flowing through the LED, and allow the gain controller to compare the set current value with the difference between the image reference value of the gamma controller and the correction value of the histogram-equalized image and determine the change in the subtraction loss value based on the power consumption difference of the display image in consideration of image quality change, brightness, and image size to designate the current value for display on the electronic display board and transmit the determined information so as to control the power-saving operation of the LED module to be performed.

* * * * *